United States Patent
Lee et al.

(10) Patent No.: US 7,416,953 B2
(45) Date of Patent: Aug. 26, 2008

(54) VERTICAL MIM CAPACITORS AND METHOD OF FABRICATING THE SAME

(75) Inventors: Charles Lee, Jhubei (TW); Chi-Hsi Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 11/263,419

(22) Filed: Oct. 31, 2005

(65) Prior Publication Data

US 2007/0099390 A1    May 3, 2007

(51) Int. Cl.
*H01L 21/20* (2006.01)

(52) U.S. Cl. .............. 438/396; 438/253; 438/387; 257/303; 257/306; 257/532; 257/E21.008

(58) Field of Classification Search ........... 438/253, 438/396; 257/296, 301, 303, 306, E21.008, 257/E21.011, E21.014, E21.018, E21.02, 257/E21.021
See application file for complete search history.

(56) References Cited

U.S. PATENT DOCUMENTS

| | | | | |
|---|---|---|---|---|
| 5,891,768 | A * | 4/1999 | Figura et al. | 438/253 |
| 6,159,862 | A * | 12/2000 | Yamada et al. | 438/712 |
| 6,180,976 | B1 | 1/2001 | Roy | 257/306 |
| 6,218,242 | B1 * | 4/2001 | Tseng | 438/253 |
| 6,265,280 | B1 * | 7/2001 | Pan | 438/396 |
| 6,417,535 | B1 * | 7/2002 | Johnson et al. | 257/306 |
| 6,451,667 | B1 * | 9/2002 | Ning | 438/397 |
| 6,528,838 | B1 * | 3/2003 | Ng et al. | 257/306 |
| 6,605,540 | B2 * | 8/2003 | Ali et al. | 438/694 |
| 6,653,186 | B2 * | 11/2003 | Won et al. | 438/253 |
| 6,667,209 | B2 * | 12/2003 | Won et al. | 438/253 |
| 7,102,189 | B2 * | 9/2006 | Nishikawa et al. | 257/311 |
| 2001/0005631 | A1 * | 6/2001 | Kim et al. | 438/689 |
| 2003/0085420 | A1 * | 5/2003 | Ito et al. | 257/309 |
| 2003/0153146 | A1 * | 8/2003 | Won et al. | 438/253 |
| 2004/0161921 | A1 * | 8/2004 | Ryu | 438/622 |
| 2005/0087838 | A1 * | 4/2005 | Hsin et al. | 257/532 |

OTHER PUBLICATIONS

S. Wolf and R.N. Tauber Silicon Processing for the VLSI vol. 1—Process Technology Lattice Press, USA (2000).*

* cited by examiner

*Primary Examiner*—Bradley W. Baumeister
*Assistant Examiner*—Eric Ward
(74) *Attorney, Agent, or Firm*—Thomas, Kayden, Horstemeyer & Risley

(57) ABSTRACT

A method of fabricating a vertical MIM capacitor. An insulation layer is formed on the substrate. The insulation layer is patterned to form an opening in a predetermined area of a core electrode. Then, the opening is filled to form a sacrificial plug. Subsequently, the insulation layer is patterned to form a trench in a predetermined area of an outer electrode around the sacrificial plug. A fenced insulation layer is formed around the sacrificial plug simultaneously. After the sacrificial plug is removed, a metal layer is filled in the predetermined area of the core and outer electrodes. A vertical MIM capacitor comprising the core electrode, the fenced insulation layer, and the outer electrode is finally formed. The invention also provides a vertical MIM capacitor.

14 Claims, 7 Drawing Sheets

VERTICAL MIM CAPACITORS AND METHOD OF FABRICATING THE SAME

BACKGROUND OF THE INVENTION

1. Field of the Invention

The present invention relates to a method of fabricating a semiconductor integrated circuit device, and more specifically to a method of fabricating a metal-insulator-metal (MIM) capacitor.

2. Description of the Related Art

Capacitors are critical elements in semiconductor integrated circuits, such as mixed signal, high frequency, analog, or digital circuits. Typically, capacitor structures for semiconductor integrated circuits include metal-insulator-semiconductor (MIS) capacitors, PN junction capacitors, and polysilicon-insulator-polysilicon (PIP) capacitors. Each of these capacitor structures include at least one silicon layer used as a capacitor electrode.

Nevertheless, the use of a silicon layer for the capacitor electrode may result in a higher series resistance and instability in high frequency circuits. Accordingly, metal-insulator-metal (MIM) capacitors have been developed to provide low series resistance. In addition, for improving element performance, the damascene process has been extensively applied in semiconductor back-end processes. Thus, it is necessary to integrate the method of fabricating capacitors with the damascene process.

Currently, capacitor fabrication integrated with a damascene process is only used for planar-type MIM capacitors, as disclosed for example, in U.S. Pat. No. 6,180,976, and illustrated in FIGS. 1a to 1c. First, referring to FIG. 1a, a substrate 100 is provided, such as a semiconductor substrate. An intermetal dielectric (IMD) layer 102 is deposited on the substrate 100, wherein a copper lower electrode 103 of the planar-type MIM capacitor is formed in the IMD layer 102 by the damascene process. Then, a capacitor dielectric layer 106 and a metal layer 108 are deposited on the IMD layer 102 in order. A photoresist layer 110 is formed on the metal layer 108 to define an upper electrode of the subsequently formed planar-type MIM capacitor.

Subsequently, referring to FIG. 1b, the photoresist layer 110 is patterned by lithography to expose a portion of the metal layer 108. The metal layer 108 uncovered by the photoresist layer 110a and the capacitor dielectric layer 106 are then etched. The remaining metal layer 108a is the upper electrode of the planar-type MIM capacitor.

Finally, referring to FIG. 1c, the planar-type MIM capacitor is formed, after removing the patterned photoresist layer 110a. The above described fabrication process includes more than one instance of lithography, thus, numerous photomasks are required, thereby increasing complexity and process cost.

Planar-type MIM capacitors cannot provide a larger effective electrode area to obtain larger capacitance for high-density future generation integrated circuits due to limited space on a wafer. Further, conductive plugs connecting the upper and lower electrodes of the planar-type MIM capacitor with peripheral devices cross through numerous metal or dielectric layers in the semiconductor structure. Accordingly, it is difficult to achieve process flexibility, such as modifying the layout of a photomask, as it will affect the fabrication of numerous layers simultaneously.

Conventional fabrication of metal interconnects requires a specific distance of at least 1000 Å be maintained between interconnects to avoid shorts. Thus, as shown in FIG. 4, a conventionally fabricated comb-type vertical MIM capacitor occupies the majority of a wafer and substantially reduces the available area thereon. In FIG. 4, 402 represents a capacitor dielectric layer, 404 represents an upper electrode, and 406 represents a lower electrode.

SUMMARY OF THE INVENTION

In order to solve the conventional problems, an object of the invention is to provide a method of integrating vertical MIM capacitor and damascene fabrication processes to simplify and improve compatibility in back-end processes. The present invention can also effectively reduce the occupied area on a wafer to fabricate more capacitors and provide larger capacitance.

The method of fabricating the vertical MIM capacitor provided in the invention includes the following steps. First, an insulation layer is formed on a substrate. Then, the insulation layer is patterned to form an opening in a predetermined area of a core electrode, and the opening is filled to form a sacrificial plug.

Subsequently, the insulation layer is patterned to form a trench in a predetermined area of an outer electrode around the sacrificial plug, and a fenced insulation layer around the remaining sacrificial plug simultaneously. The sacrificial plug is then removed, and a metal layer is filled in the predetermined area of the core and outer electrodes. Finally, a vertical MIM capacitor made up of the core electrode, the fenced insulation layer, and the outer electrode is formed. In addition, a damascene interconnect or a semiconductor element is formed under the vertical MIM capacitor, and connected thereto by a conductive plug.

Another object of the invention is to provide a vertical MIM capacitor structure including a column core electrode installed on a substrate vertically, a fenced insulation layer around the column core electrode, and a circular outer electrode around the fenced insulation layer, wherein the circular outer electrode and the column core electrode are concentric structures.

The column shaped vertical MIM capacitor provided by the present invention allow conductive plugs to connect the core and outer electrodes thereof with peripheral elements extending up or down in the same direction. Consequently, the number of layers which conductive plugs cross though in the present invention is less than the conventional method, thus enhancing process flexibility.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 2a~2h illustrate cross sections of the method of fabricating the vertical MIM capacitor according to the invention. FIG. 3 is a flow chart thereof.

Figure 1A:
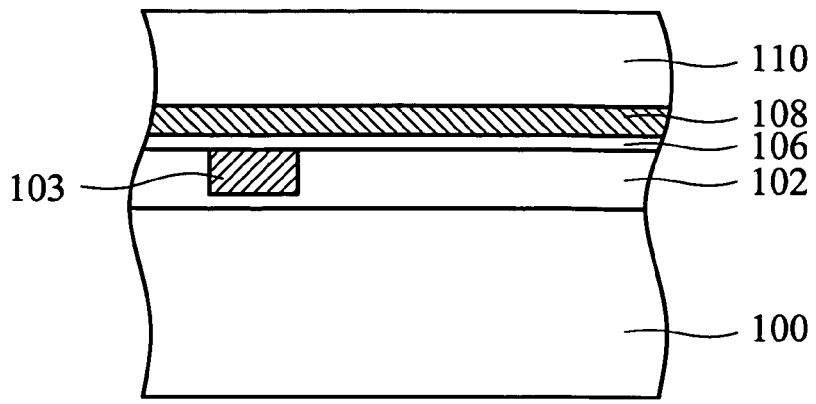
FIGS. 1a~1c are cross sections of fabricating a planar-type capacitor as disclosed in U.S. Pat. No. 6,180,976.
Figure 1B:
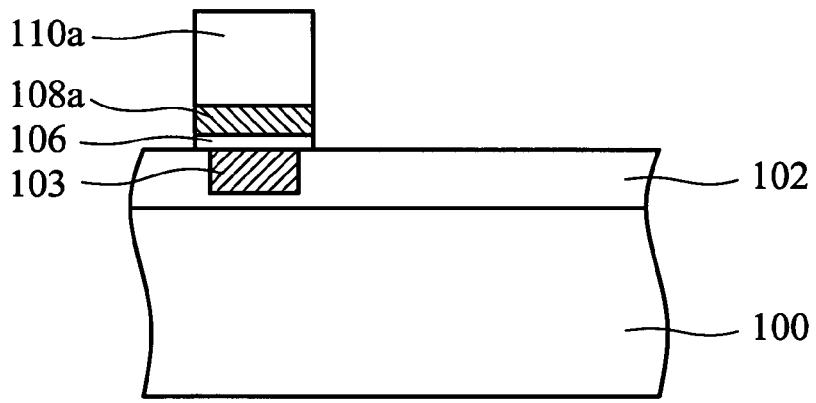
Figure 1C:
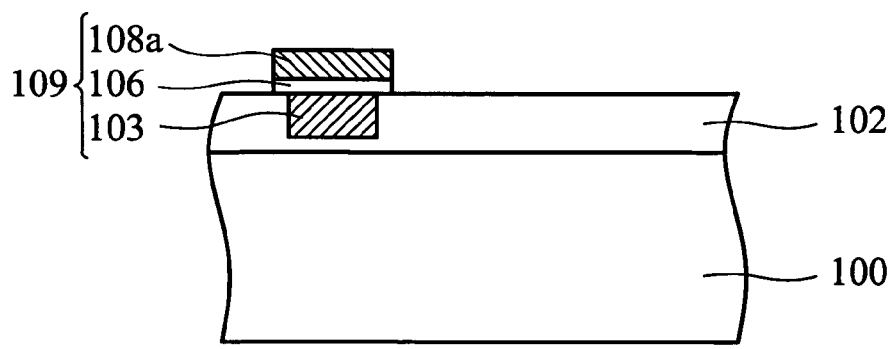
Figure 2A:
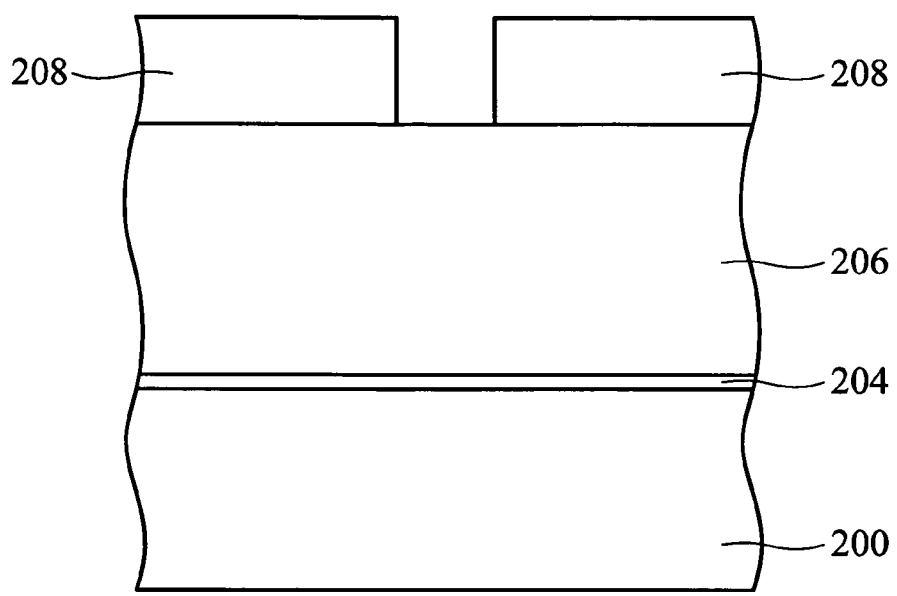
FIGS. 2a~2h are cross sections of the method of fabricating a vertical MIM capacitor in an embodiment of the invention.
Figure 3:
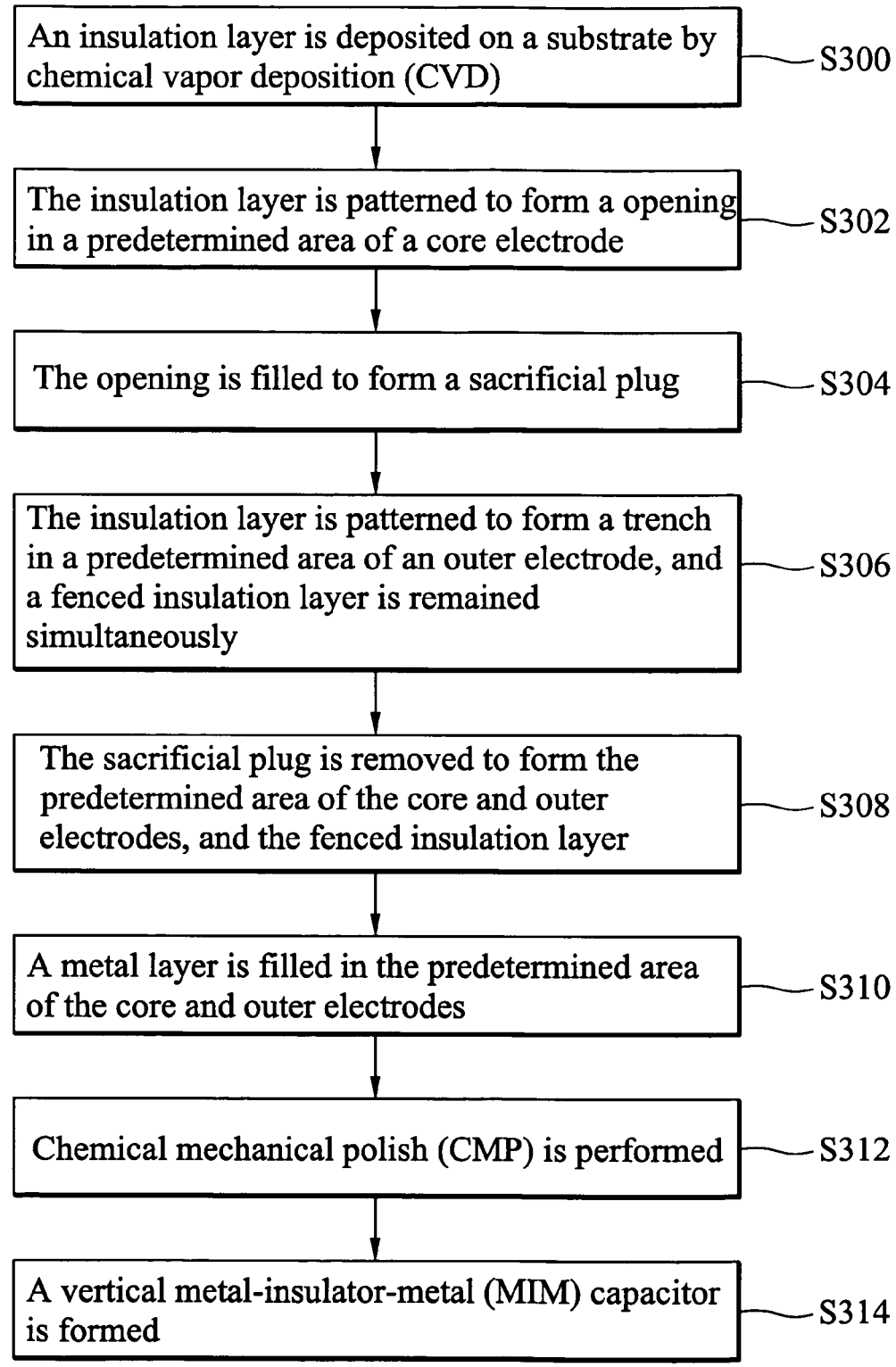
FIGS. 3 is a flow chart of the method of fabricating a vertical MIM capacitor in an embodiment of the invention.
Figure 4:
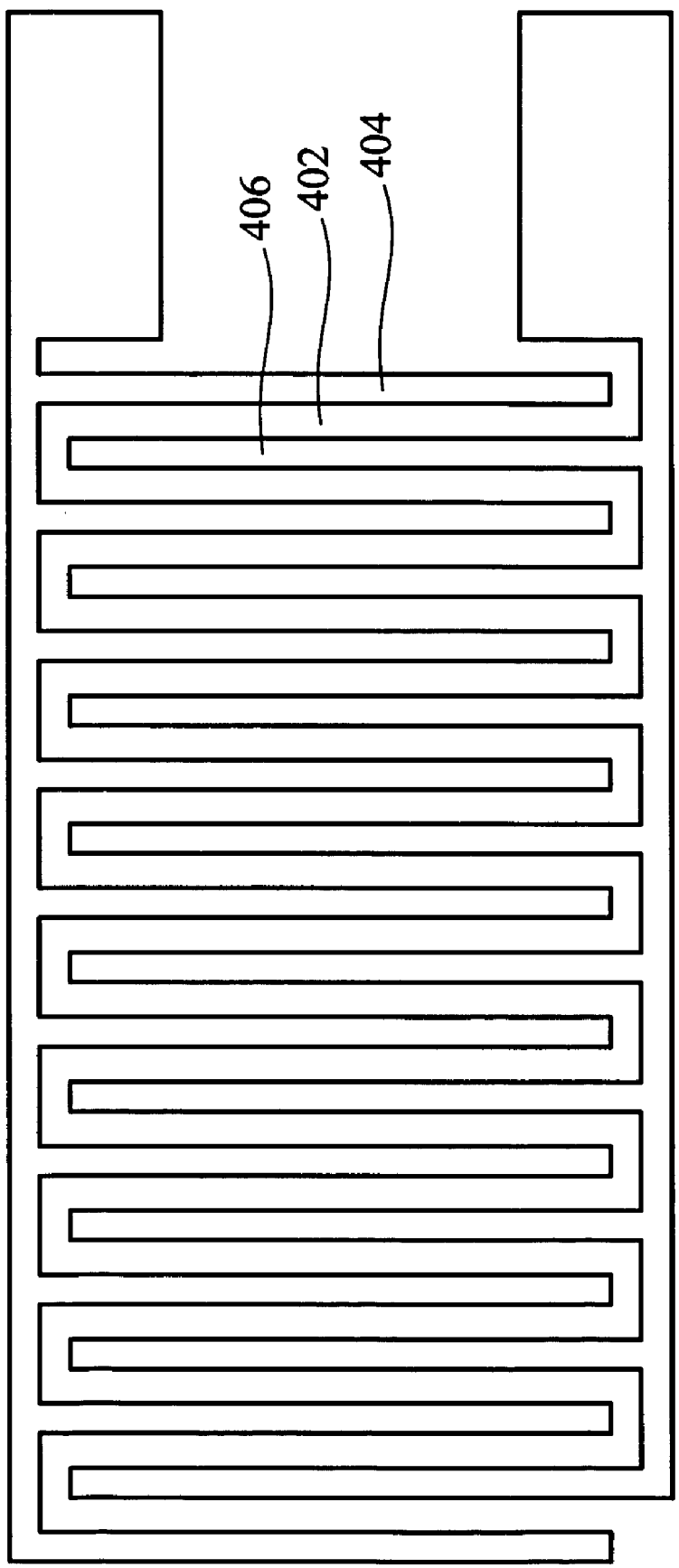
FIGS. 4 is a plane view of a comb-type capacitor.

In FIG. 2a, which illustrates the initial step of the invention, 200 represents a substrate. An etch stop layer 204, an insulation layer 206, and a photoresist layer 208 having a core electrode pattern are formed on the substrate 200 in order.

The substrate 200 may contain a variety of elements, for example, MOS transistors, resistance, logic device, or metal interconnects (not shown). The substrate 200 is a silicon substrate. The etch stop layer 204 is composed of silicon nitride, silicon oxide, or silicon-oxy-nitride.

The thickness of the insulation layer 206 is about 6000~10000 Å. The insulation layer 206 comprises (1) silicon oxide formed by plasma, low-K spin-on glass (SOG), tetraethyl-ortho-silicate (TEOS) glass, silicon nitride, phosphosilicate oxide, fluorosilicate oxide, silicon-oxy-nitride, fluorosilicate glass (FSG), phosphosilicate glass (PSG), undoped silicate glass formed by high density plasma (HDP-USG), silicon oxide formed by high density plasma, silicon oxide formed by sub-atmospheric pressure chemical vapor deposition (SACVD), or ozone-TEOS, wherein the used inter-metal dielectric (IMD) layer is (2) SOG, silicon oxide, borophosphosilicate glass (BPSG), or TEOS, using an inter-layer dielectric (ILD) layer, or (3) lead zirconate titanate (PZT), strontium bismuth tantalite (SBT), bismuth strontium tantalite (BST), or strontium tantalite (ST), using a capacitor dielectric layer, preferably PZT, SBT, BST, or ST.

Referring to FIG. 3, the insulation layer 206 is formed by chemical vapor deposition (CVD) S300, such as high density plasma CVD (HDPCVD), plasma enhanced CVD (PECVD), or by spin coating. After the insulation layer 206 is formed, an anti-reflective layer (not shown) is formed on the insulation layer 206. The anti-reflective layer is composed of organic anti-reflective layer, such as Novolak, inorganic anti-reflective layer, such as titanium nitride (TiN) or tungsten nitride (TiW), or dielectric anti-reflective layer, such as silicon oxide or silicon-oxy-nitride.

Figure 2B:
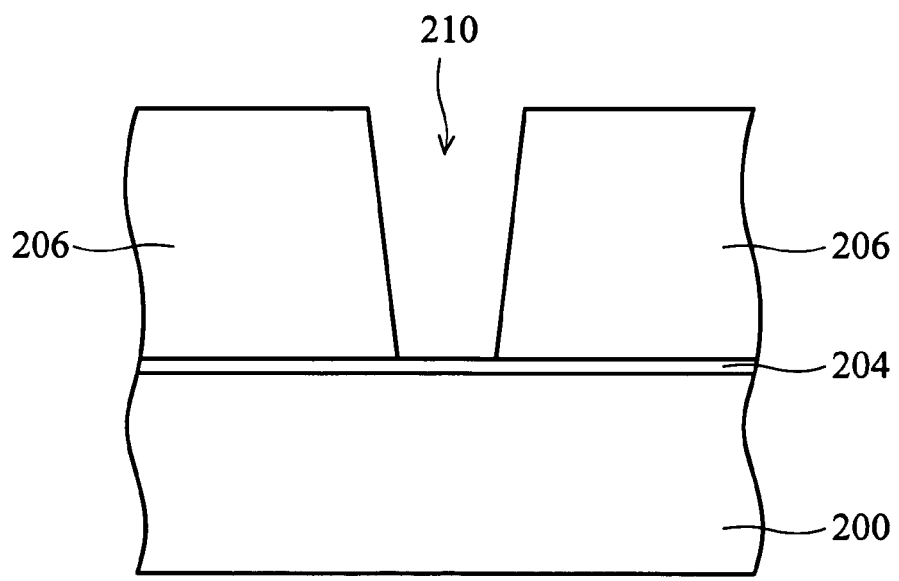

Next, the etching S302 is performed, such as the insulation layer 206 is patterned using the photoresist layer 208 having the core electrode pattern as a mask to form a opening 210, exposing the etch stop layer 204, then the photoresist layer 208 is removed, as shown in FIG. 2b, wherein the opening 210 is a predetermined area of a core electrode.

Figure 2C:
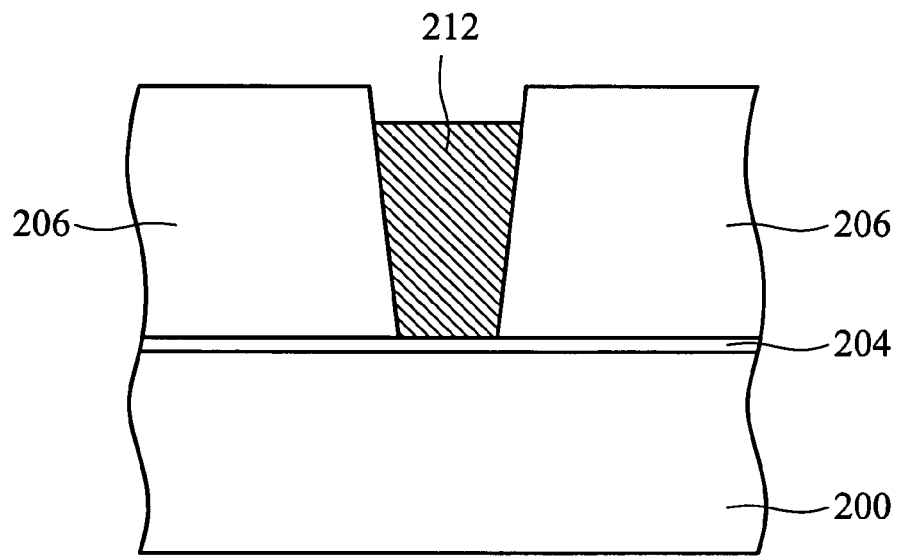

Subsequently, the opening 210 is filled to form a sacrificial plug 212 by the filling S304, as shown in FIG. 2c. The sacrificial plug 212 is composed of silicon nitride, silicon carbon, silicon-oxy-nitride, copper, aluminum-copper alloy, aluminum alloy, or tungsten. The above materials are selected from the group having a high etching selectivity to form the insulation layer 206, wherein the etching selectivity is about 3~5. The height of the sacrificial plug 212 is about 3500~7000 Å.

A photoresist layer 214 having a circular trench pattern is formed on the insulation layer 206. The insulation layer 206 is patterned using the photoresist layer 214 as a mask. The etching S306 comprises inductive coupled plasma (ICP) or reactive ion etching (RIE).

Figure 2D:
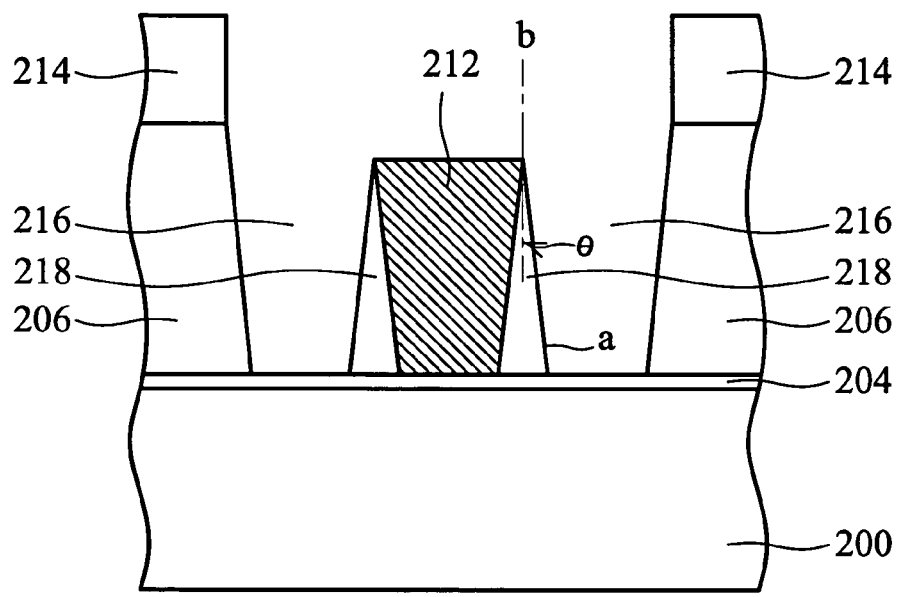

After the etching S306, a trench 216 around the sacrificial plug 212 is formed, exposing the etch stop layer 204, wherein the trench 216 is a predetermined area of an outer electrode. As shown in FIG. 2d, a fenced insulation layer 218 remains between the sacrificial plug 212 and the trench 216 and around the sacrificial plug 212 while the trench 216 is formed. The fenced insulation layer 218 is a capacitor dielectric layer.

The included angle θ between the hypotenuse a of the fenced insulation layer 218 and the normal vector b of the substrate 200 is not greater than about 20°, preferably 10~15°, as shown in FIG. 2d. The width of the fenced insulation layer 218 (as the thickness of the capacitor dielectric layer) is about 300~500 Å. In recent developments for reducing sizes of elements to enhance integration density, a capacitor having high capacitance and superior electrical characteristics can be provided by controlling the thickness of the capacitor dielectric layer to within 300~500 Å.

Etching gases comprise $C_xF_y$, $O_2$, $Cl_2$, CO, or combinations thereof at the pressure of 5~100 mTorr. The flow rate thereof is about 5~300 sccm. The source power of the etcher is about 100~1500W. Carrier gases comprise $N_2$ or Ar in the etching S306, wherein the flow rate thereof is about 5~300 sccm.

The prior art method of obtaining a thin capacitor dielectric layer by lithography, suffers from several limitations, for example, extra photomasks are required to define the capacitor dielectric layer, thereby increasing the cost and complexity of the process. Additionally, at 300~500 Å, the capacitor dielectric layer is extremely thin and due to this it is difficult to obtain an expected pattern size in the photoresist layer during lithography as the patterns may be unresolved. Nevertheless, even if the expected pattern is successfully formed the extremely thin photoresist layer pattern may also be damaged due to poor etchant resistance.

In the present invention, the included angle θ between the hypotenuse a of the fenced insulation layer 218 and the normal vector b of the substrate 200 can be precisely controlled by optimizing the etching parameters, thereby obtaining the desired capacitor dielectric layer thickness. Further, the capacitor dielectric layer 218 remains intact while the predetermined area of the outer electrode is formed by etching. Compared to the prior art, the present invention is simplified and has lower process cost as additional photomasks are not required.

Figure 2E:
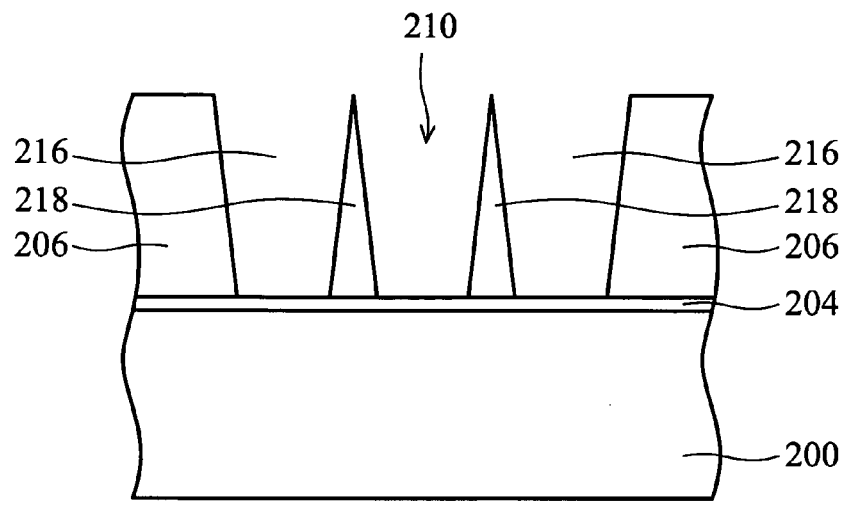
Figure 2F:
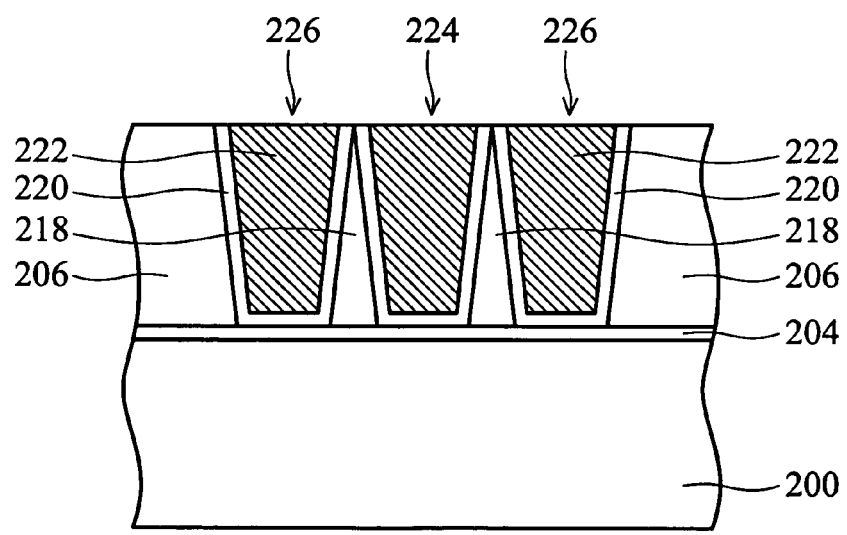

Step S308 is performed to remove the photoresist layer 214 and the sacrificial plug 212 by plasma to form the predetermined area of the core electrode 210, the predetermined area of the outer electrode 216, and the fenced insulation layer 218, as shown in FIG. 2e.

A barrier layer 220 is conformally formed on the bottom and sidewalls of the predetermined area of the core electrode 210, the predetermined area of the outer electrode 216, and the fenced insulation layer 218 to increase adhesion between the insulation layer 206 and the subsequently filled metal layer. The barrier layer 220 comprises a metal barrier layer, such as tantalum (Ta), tantalum nitride (TaN), titanium (Ti), or titanium nitride (TiN), or a dielectric barrier layer, such as oxide layer.

Next, step S310 is performed to fill a metal layer 222 in the predetermined area of the core electrode 210 and the predetermined area of the outer electrode 216. The metal layer 222 is composed of copper, aluminum-copper alloy, aluminum alloy, or tungsten, preferably copper. The core and subsequently formed outer electrodes can contain the same material as used in the filling step S310. The core and outer electrodes can be filled with different materials using another method, for example, dividing the filling S310 into two steps, filling in the predetermined area of the core electrode 210 first, followed by the predetermined area of the outer electrode 216.

Finally, a planarization step S312 is performed by chemical mechanical polish (CMP) to remove the uneven metal layer 222 and level the openings of the predetermined area of the core electrode 210 and the predetermined area of the outer electrode 216. Then, a vertical MIM capacitor is formed, such as that formed in the step S314. The MIM capacitor comprises the core electrode 224, the outer electrode 226, and the capacitor dielectric layer 218.

A detailed description of the vertical MIM capacitor structure is given in the following. The core electrode 224 is a column structure, such as a cylinder electrode, vertically installed on the substrate 200. The fence-like capacitor insulation layer 218 is installed around the column core electrode 224, and the outer electrode 226 is a circular structure installed around the fenced insulation layer 218, wherein the column core electrode 224 and the circular outer electrode 226 are concentric structures.

Figure 2G:
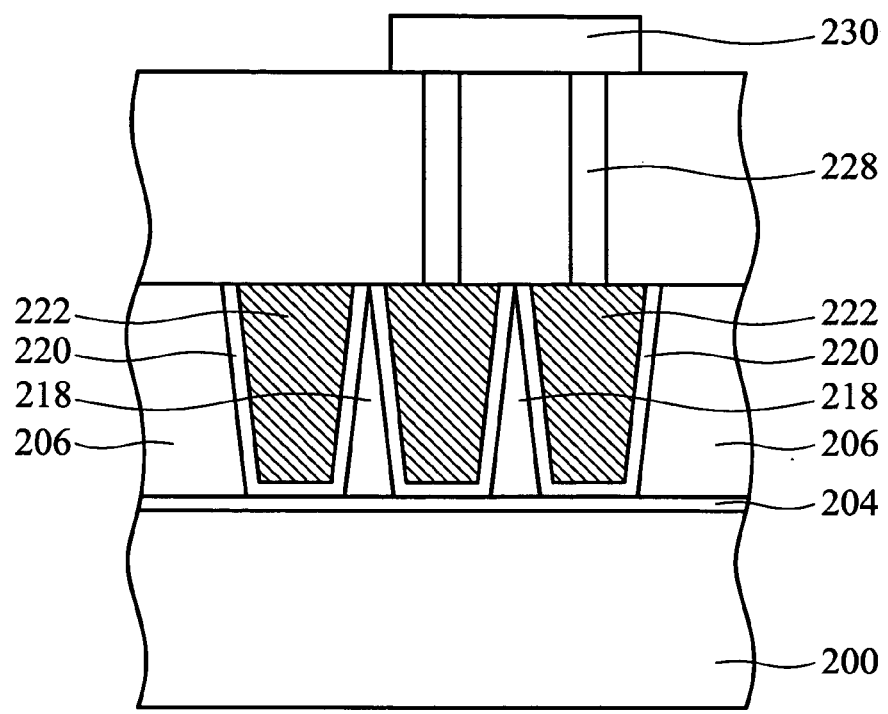
Figure 2H:
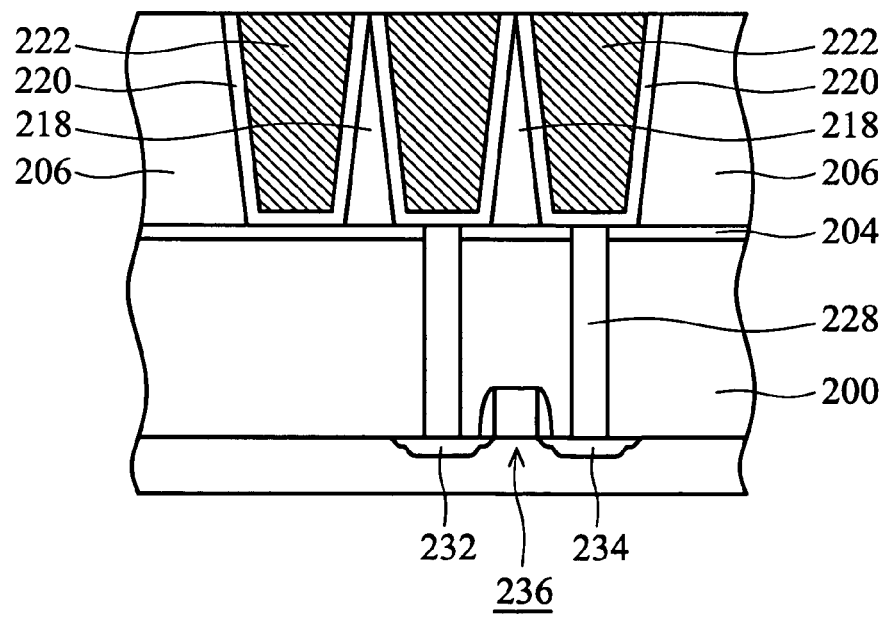

The conductive plugs 228 connecting the capacitor can extend up or down in the same direction to connect elements in other layers due to the vertical installation of the column core electrode 224 and the circular outer electrode 226, as shown in FIG. 2g (connecting to a conductive line 230 above the capacitor, extending from the upper portion of the capacitor), and FIG. 2h (connecting to a source 232 and a drain 234 of a transistor 236 below the capacitor, extending from the lower portion of the capacitor). Compared to the prior art in which conductive plugs connect with the planar-type capacitor and extend in different directions to connect external elements, the number of layers which conductive plugs cross through in the present invention is fewer than in the prior art and facilitates process flexibility.

The method of integrating the vertical MIM capacitor and damascene fabrication process does not require additional photomasks, as only the original photomasks from the damascene process are used, and the fabrication process can be performed in any semiconductor layer to satisfy industry requirements. In conclusion, the present invention provides a simple and convenient process.

Further, due to limited wafer space, planar-type capacitors cannot provide a larger effective electrode area to obtain larger capacitance for high-density future generation integrated circuits. Nevertheless, the present invention can effectively reduce the occupied area on a wafer leaving a larger area available for the fabrication of more capacitors and increasing capacitance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a vertical metal-insulator-metal (MIM) capacitor, comprising:
   forming an insulation layer on a substrate;
   etching the insulation layer to form an opening;
   filling the opening to form a sacrificial plug;
   etching the insulation layer to form a trench around the sacrificial plug, and leaving a fenced insulation layer around the sacrificial plug simultaneously, wherein the fenced insulation layer is a capacitor dielectric layer;
   removing the sacrificial plug; and
   filling a metal layer in the opening and the trench to form a core electrode and an outer electrode, wherein the formation of the core electrode and the outer electrode occurs after the formation the fenced insulation layer.

2. The method as claimed in claim 1, further comprising forming a damascene interconnect on the substrate electrically connecting the vertical MIM capacitor by a conductive plug.

3. The method as claimed in claim 1, further comprising forming a semiconductor element on the substrate electrically connecting the vertical MIM capacitor by a conductive plug.

4. The method as claimed in claim 1, further comprising forming an etch stop layer before the insulation layer is formed.

5. The method as claimed in claim 1, wherein the sacrificial plug has a height of about 3500~7000 Å.

6. The method as claimed in claim 1, wherein the fenced insulation layer has an included angle with a vertical vector less than 20°.

7. The method as claimed in claim 1, wherein the fenced insulation layer has a width of about 300~500 Å.

8. The method as claimed in claim 1, wherein the insulation layer is etched with reactive gases comprising $C_xF_y$, $O_2$, $Cl_2$, CO, or combinations thereof.

9. The method as claimed in claim 8, wherein the reactive gases have flow rates of about 5~300 sccm.

10. The method as claimed in claim 1, wherein the insulation layer is etched with carrier gases comprising $N_2$ or Ar.

11. The method as claimed in claim 10, wherein the carrier gases have flow rates of about 5~300 sccm.

12. The method as claimed in claim 1, wherein the insulation layer is etched at an etching pressure of about 5~100 mtorr.

13. The method as claimed in claim 1, wherein the insulation layer is etched with an etching power of about 100~1500 W.

14. The method as claimed in claim 1, wherein an etching selectivity of the insulation layer to the sacrificial plug is about 3~5.

* * * * *